United States Patent
Hara et al.

(10) Patent No.: US 9,859,033 B2
(45) Date of Patent: Jan. 2, 2018

(54) CONDUCTIVE FILM AND ELECTRONIC DEVICE HAVING CONDUCTIVE FILM

(71) Applicant: LINTEC Corporation, Itabashi-Ku, Tokyo (JP)

(72) Inventors: Tsutomu Hara, Tokyo (JP); Satoshi Naganawa, Tokyo (JP); Koichi Nagamoto, Tokyo (JP)

(73) Assignee: LINTEC Corporation, Tokyo (JP)

( * ) Notice: Subject to any disclaimer, the term of this patent is extended or adjusted under 35 U.S.C. 154(b) by 119 days.

(21) Appl. No.: 14/888,754

(22) PCT Filed: Apr. 16, 2014

(86) PCT No.: PCT/JP2014/060791
§ 371 (c)(1),
(2) Date: Nov. 3, 2015

(87) PCT Pub. No.: WO2014/188822
PCT Pub. Date: Nov. 27, 2014

(65) Prior Publication Data
US 2016/0086683 A1   Mar. 24, 2016

(30) Foreign Application Priority Data
May 23, 2013   (JP) .................. 2013-108523

(51) Int. Cl.
*H01B 1/06* (2006.01)
*H01B 5/14* (2006.01)
(Continued)

(52) U.S. Cl.
CPC ............. *H01B 1/08* (2013.01); *C23C 14/086* (2013.01); *H01B 5/14* (2013.01);
(Continued)

(58) Field of Classification Search
CPC ......................................... H01L 29/43–29/518
See application file for complete search history.

(56) References Cited

U.S. PATENT DOCUMENTS 4,610,771 A * 9/1986 Gillery ................... C03C 17/36
204/192.1
2005/0129863 A1 6/2005 O'Shaughnessy
(Continued)

FOREIGN PATENT DOCUMENTS

JP   0003501820 B   9/1994
JP   2003526732 A   9/2003
(Continued)

OTHER PUBLICATIONS

Machine translation of JP 2012-053594 A, Mar. 2012.*
European Patent Office Extended European Search Report for EP 14 80 1737 dated Feb. 23, 2017.

*Primary Examiner* — Ramsey E Zacharia
(74) *Attorney, Agent, or Firm* — Renner, Kenner, Arthur M. Reginelli

(57) ABSTRACT

Provided are a conductive film which is excellent in hygrothermal characteristics and has excellent bending performance, and an electronic device having such a conductive film.
A conductive film is obtained by forming, on one surface or both surfaces of a substrate, a zinc tin oxide (ZTO) layer and a transparent conductive film that is formed of zinc oxide other than zinc tin oxide sequentially from the substrate side, in which a thickness of the zinc tin oxide layer is 5 to 500 nm, a thickness of the zinc oxide-based transparent conductive film is 5 to 1000 nm, and a water-vapor transmittance rate of the zinc tin oxide (ZTO) layer is 0.1 g/(m²·day) or less.

3 Claims, 1 Drawing Sheet

(51) Int. Cl.
  *C23C 14/06* (2006.01)
  *H01B 1/08* (2006.01)
  *H01L 31/0224* (2006.01)
  *H01L 31/18* (2006.01)
  *C23C 14/08* (2006.01)

(52) U.S. Cl.
  CPC .. *H01L 31/022466* (2013.01); *H01L 31/1884* (2013.01); *H01L 31/022483* (2013.01); *Y02E 10/50* (2013.01)

(56) References Cited

U.S. PATENT DOCUMENTS

| | | |
|---|---|---|
| 2007/0002422 A1 | 1/2007 | O'Shaughnessy |
| 2007/0215456 A1 | 9/2007 | Abe et al. |
| 2009/0120496 A1 | 5/2009 | Koo et al. |
| 2009/0202747 A1 | 8/2009 | Yukinobu et al. |
| 2009/0286071 A1 * | 11/2009 | Sasa ............... C08J 7/04 428/336 |
| 2009/0308444 A1 | 12/2009 | Peter |
| 2010/0315693 A1 | 12/2010 | Lam et al. |

FOREIGN PATENT DOCUMENTS

| | | |
|---|---|---|
| JP | 2007314364 A | 12/2007 |
| JP | 2008545168 A | 12/2008 |
| JP | 2009302029 A | 12/2009 |
| JP | 2009302032 A | 12/2009 |
| JP | 2011504293 A | 2/2011 |
| JP | 2012053594 A * | 3/2012 |
| JP | 2012069515 A | 4/2012 |
| JP | 2012529661 A | 11/2012 |
| WO | 2011019040 A1 | 2/2011 |

* cited by examiner

CONDUCTIVE FILM AND ELECTRONIC DEVICE HAVING CONDUCTIVE FILM

TECHNICAL FIELD

The present invention relates to a conductive film and an electronic device having the conductive film, and particularly, to a conductive film which is excellent in hygrothermal characteristics and has excellent bending performance, and an electronic device having such a conductive film.

BACKGROUND ART

Hitherto, a transparent conductive film obtained by stacking, on a transparent plastic film, a gas barrier layer and a transparent electrode in order from the bottom has been proposed for a transparent electrode of an image display apparatus provided with a liquid crystal device or an organic electroluminescence device (organic EL element) in order to implement a reduction in thickness, a reduction in weight, an increase in flexibility, and the like.

In this regard, for example, a transparent conductive film is disclosed in which a predetermined inorganic barrier thin film and a transparent conductive thin film of a metal oxide including indium oxide as a main component are formed on a substrate having a predetermined thickness (for example, see Patent Document 1).

That is, Patent Document 1 discloses a transparent conductive film obtained by forming, on a substrate, an inorganic barrier thin film that is formed of a metal oxide including silicon oxide as a main component and/or a metal nitride including silicon nitride as a main component, and a transparent conductive thin film of a metal oxide including indium oxide as a main component, the transparent conductive film having a predetermined oxygen transmittance rate after a bending test.

On the other hand, as a material for forming a transparent conductive layer in a transparent conductive film, tin-doped indium oxide (ITO) is mainly used. However, indium used as one of the forming materials is a rare metal and is relatively expensive. Therefore, application of a transparent conductive material other than indium has been examined.

In this regard, for example, a transparent conductive laminate is disclosed in which a silicon-containing inorganic layer having a predetermined thickness, a carbon nanotube layer having a predetermined thickness, and a transparent protective layer having a predetermined thickness are formed on at least one surface of a substrate having a predetermined thickness (for example, see Patent Document 2).

That is, Patent Document 2 discloses a transparent conductive laminate including a carbon nanotube layer as a conductive layer, in which a silicon-containing inorganic layer contains a predetermined coexistence phase of zinc sulfide and silicon dioxide.

Furthermore, a transparent conductive film and a manufacturing method therefor are proposed in which even when the film thickness of a ZnO-based transparent conductive thin film is thin, the transparent conductive film exhibits a low resistance value and has a low rate of change in resistance value even under a humidification and heating environment (for example, see Patent Document 3).

More specifically, Patent Document 3 proposes a transparent conductive film including: an aluminum oxide thin film or a silicon oxide thin film, which has an oxygen content corresponding to 60 to 90% of the stoichiometric value, formed as a first oxide thin film with a high visible-light transmittance on an organic polymer film substrate; a ZnO-based transparent conductive thin film formed on the first oxide thin film; and a second oxide thin film with a high visible-light transmittance and a water-vapor transmittance rate equal to or less than a predetermined value.

CITATION LIST

Patent Document

Patent Document 1: JP 3501820 B1 (Claims and Specification)

Patent Document 2: JP 2012-69515 A (Claims and Specification)

Patent Document 3: JP 2009-302032 A (Claims and Specification)

DISCLOSURE OF THE INVENTION

Problem to be Solved by the Invention

However, regarding the transparent conductive film disclosed in Patent Document 1, although there is a description on the water-vapor transmittance rate or the like when the conductive film is wound around a stainless steel round bar having a diameter of 20 mmφ a predetermined number of times, a problem arises in which deterioration of a display element may not be sufficiently suppressed yet.

Furthermore, it is disclosed that the conductive laminate described in Patent Document 2 is excellent in bending performance. However, from the viewpoint of performance improvement of devices such as organic EL and solar cells and power consumption, a problem arises in which the conductive laminate does not have sufficient sheet resistance yet.

Furthermore, according to the transparent conductive film and the manufacturing method therefor disclosed in Patent Document 3, the film thickness dependency of the ZnO-based transparent conductive thin film with respect to the specific resistance is improved to some extent by the presence of the predetermined first oxide thin film. However, regarding the problem that a sheet resistance value of a zinc oxide-based material is increased with respect to moisture or heat as compared to tin-doped indium oxide, a problem arises in which there is no description on bending characteristics.

In this regard, the inventors of the present invention conducted a thorough investigation on such problems, and as a result, they found that when a conductive film is configured by forming, on one surface or both surfaces of a substrate, a zinc tin oxide layer and a transparent conductive film that is formed of zinc oxide other than zinc tin oxide sequentially from the substrate side, the conductive film is excellent in bending characteristics as well as hygrothermal characteristics. Thus, the inventors completed the present invention.

That is, an object of the present invention is to provide a conductive film which is excellent in hygrothermal characteristics and also excellent in bending characteristics, and an electronic device having such a conductive film.

Means for Solving Problem

According to an aspect of the present invention, there is provided a conductive film obtained by forming, on one surface or both surfaces of a substrate, a zinc tin oxide (ZTO) layer and a transparent conductive film that is formed of zinc oxide other than zinc tin oxide sequentially from the substrate side. Thus, the problems described above can be solved.

That is, when the zinc oxide-based transparent conductive film is formed on the substrate with the zinc tin oxide layer interposed therebetween, adhesiveness between the zinc tin oxide layer and the zinc oxide-based transparent conductive film is improved, the zinc oxide-based transparent conductive film is less likely to be peeled off even when the conductive film is bent, and thus bendability can be improved.

Furthermore, since the zinc tin oxide layer can block moisture from the substrate, conductivity of the zinc oxide-based transparent conductive film is prevented from deteriorating due to the moisture, and even when the conductive film is under a humidification and heating environment, an increase in surface resistivity can be prevented.

Furthermore, on the occasion of configuring the conductive film of the present invention, it is preferable that a thickness of the zinc tin oxide (ZTO) layer is 5 to 500 nm.

When such a configuration is adopted, moisture from the substrate can be blocked suitably, and conductivity of the zinc oxide-based transparent conductive film can be prevented from deteriorating due to the moisture.

Furthermore, on the occasion of configuring the conductive film of the present invention, it is preferable that a thickness of the zinc oxide-based transparent conductive film is 5 to 1000 nm.

When such a configuration is adopted, a transparent conductive film having a low surface resistivity and a high light transmittance can be obtained.

Furthermore, on the occasion of configuring the conductive film of the present invention, it is preferable that a water-vapor transmittance rate of the zinc tin oxide (ZTO) layer is 0.1 g/(m$^2$·day) or less.

When such a configuration is adopted, since moisture from the substrate can be blocked, conductivity of the zinc oxide-based transparent conductive film is prevented from deteriorating due to the moisture, and even when the conductive film is under a humidification and heating environment, an increase in surface resistivity can be prevented.

Furthermore, on the occasion of configuring the conductive film of the present invention, it is preferable that when a surface resistivity of the conductive film before bending is designated as R1, a surface resistivity of the conductive film after bending of the conductive film using an acrylic round bar having a diameter of 6 mm with the zinc oxide-based transparent conductive film facing inward for 30 seconds is designated as R2, and a surface resistivity of the conductive film after bending of the conductive film using an acrylic round bar having a diameter of 8 mm with the zinc oxide-based transparent conductive film facing outward for 30 seconds is designated as R2', both of R2/R1 and R2'/R1 are a value of 1.5 or less.

When such a configuration is adopted, a conductive film excellent in bending characteristics can be obtained.

Furthermore, on the occasion of configuring the conductive film of the present invention, it is preferable that the substrate is formed of at least one selected from the group consisting of polyesters, polyimides, polyamides, and cycloolefin-based polymers.

When such a configuration is adopted, a conductive film excellent in flexibility and transparency can be obtained.

Furthermore, on the occasion of configuring the conductive film of the present invention, it is preferable that the zinc tin oxide (ZTO) layer contains zinc at a value within the range of 1 to 49 atom %, and tin at a value within the range of 1 to 30 atom % relative to the sum (100 atom %) of zinc, tin, and oxygen as measured by XPS elemental analysis.

When such a configuration is adopted, adhesiveness between the zinc tin oxide layer and the zinc oxide-based transparent conductive film can be improved.

Furthermore, according to another aspect of the present invention, there is provided an electronic device having the conductive film described above.

When the conductive film which is excellent in hygrothermal characteristics and has excellent bending performance is provided in this way, it is possible to obtain an electronic device with a small change in electrical characteristics even when the conductive film is bent or stretched, for example, the conductive film is pasted onto a shape with a curved surface.

MODES FOR CARRYING OUT THE INVENTION

First Embodiment

Figure 1:
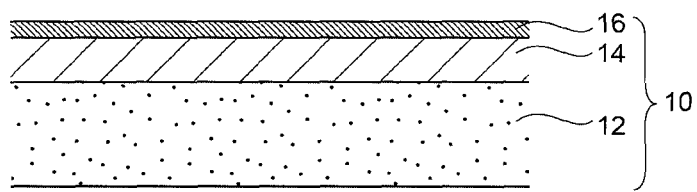
FIG. 1 is a diagram provided to describe the form of a conductive film of the present invention.

A first embodiment relates to a conductive film 10 obtained by forming, on one surface or both surfaces of a substrate 12, a zinc tin oxide (ZTO) layer 14 and a transparent conductive film 16 that is formed of zinc oxide other than zinc tin oxide sequentially from the substrate 12 side, as illustrated in FIG. 1.

Hereinafter, the conductive film of the first embodiment will be described specifically with appropriate reference to the drawings.

1. Substrate (1) Kind

As a material used for the substrate 12 illustrated in FIG. 1, a resin film, glass, ceramic, and the like are exemplified. The resin film is not particularly limited as long as it is excellent in flexibility and transparency, and examples thereof include resin films of polyimides, polyamides, polyamideimides, polyphenylene ethers, polyether ketones, polyether ether ketones, polyolefins, polyesters, polycarbonates, polysulfones, polyether sulfones, polyphenylene sulfides, polyarylates, acrylic-based resins, cycloolefin-based polymers, aromatic polymers, polyurethane-based polymers, and the like.

Among these, from the viewpoint of having excellent transparency and versatility, at least one selected from the group consisting of polyesters, polyimides, polyamides, and cycloolefin-based polymers is preferable, and polyesters or cycloolefin-based polymers are more preferable.

More specifically, examples of the polyesters include polyethylene terephthalate, polybuthylene terephthalate, polyethylene naphthalate, and polyarylate.

Furthermore, examples of the polyamides include wholly aromatic polyamides, nylon 6, nylon 66, and nylon copolymers.

Furthermore, examples of the cycloolefin-based polymers include norbornene-based polymers, monocyclic olefin-based polymers, cyclic conjugated diene-based polymers, vinyl alicyclic hydrocarbon polymers, and hydrogenated products thereof. For example, APEL (ethylene-cycloolefin copolymer manufactured by Mitsui Chemicals Inc.), ARTON (norbornene-based polymer manufactured by JSR Corporation), ZEONOR (norbornene-based polymer manufactured by ZEON CORPORATION), and the like are exemplified.

(2) Film Thickness

Furthermore, the film thickness of the substrate 12 illustrated in FIG. 1 may be decided depending on the purpose of use or the like. From the viewpoint of flexibility and handleability, the film thickness is set to be preferably a value within the range of 1 to 1000 μm, more preferably a value within the range of 5 to 250 μm, and further preferably a value within the range of 10 to 200 μm.

(3) Surface Roughness

As an index for the surface roughness of the substrate, an arithmetic mean roughness (Ra) defined by JIS B 0601 is preferably a value within the range of 0.1 to 10 nm.

The reason for this is that, when the arithmetic mean roughness (Ra) of the substrate is a value within the above-described range, adhesiveness between the substrate and the zinc tin oxide layer is sufficiently obtained and thus the water-vapor transmittance rate of the zinc tin oxide layer can be prevented from excessively increasing even after a bending test.

Therefore, the arithmetic mean roughness (Ra) of the substrate is more preferably a value within the range of 0.5 to 5 nm.

Furthermore, for the same reason, the maximum sectional height (Rt) of a roughness curve of the substrate is preferably a value within the range of 0.1 to 100 nm and more preferably a value within the range of 1 to 50 nm.

Incidentally, Ra and Rt of the substrate can be measured using an optical interference microscope as described specifically in Example 1.

(4) Additive

Furthermore, the substrate may include various additives such as antioxidants, flame retardants, and lubricants in addition to the above-described resin component as long as the transparency and the like are not impaired.

2. Zinc Tin Oxide (ZTO) Layer (1) Configuration

The zinc tin oxide (ZTO) layer 14 illustrated in FIG. 1 is formed between the substrate 12 and the zinc oxide-based transparent conductive film 16, and even when infiltration of water vapor or the like occurs while the water vapor or the like passes through the substrate 12, the zinc tin oxide (ZTO) layer 14 prevents further infiltration of the water vapor or the like. As a result, the zinc tin oxide (ZTO) layer 14 is a layer for preventing the zinc oxide-based transparent conductive film 16 from deteriorating.

Furthermore, since the zinc oxide (ZTO) layer 14 is excellent in adhesiveness between the substrate 12 and the zinc oxide-based transparent conductive film 16, it is possible to obtain a conductive film with small deterioration in conductivity even when the conductive film is under a humidification and heating environment or is bent or stretched.

Furthermore, the zinc tin oxide layer contains zinc preferably at a value within the range of 1 to 49 atom %, more preferably at a value within the range of 10 to 45 atom %, and further preferably at a value within the range of 20 to 45 atom %, relative to the total amount (100 atom %) of zinc, tin, and oxygen as measured by an X-ray photoelectron spectroscopic analysis (XPS elemental analysis).

The reason for this is that, when the ratio of zinc is within the range, the adhesiveness with the zinc oxide-based transparent conductive film is favorable in a wide range of film formation conditions and it is easy to obtain an effect of blocking moisture.

Furthermore, the zinc tin oxide layer contains tin more preferably at a value within the range of 1 to 30 atom %, more preferably at a value within the range of 5 to 25 atom %, further preferably at a value within the range of 10 to 20 atom %, relative to the total amount of zinc, tin, and oxygen such as 100 atom %.

The reason for this is that, when the ratio of tin is the value within the range, the adhesiveness with the zinc oxide-based transparent conductive film is favorable and it is easy to obtain an effect of blocking moisture.

Therefore, since infiltration of moisture from the substrate can be blocked, the conductivity of the zinc oxide-based transparent conductive film is prevented from deteriorating due to the moisture, and even when the conductive film is under a humidification and heating environment, the surface resistivity can be prevented from increasing.

Incidentally, such a zinc tin oxide layer may contain other mixing components such as various polymer resins, curing agents, anti-ageing agents, light stabilizers, and flame retardants.

(2) Film Thickness

Furthermore, the film thickness of the zinc tin oxide (ZTO) layer 14 illustrated in FIG. 1 is set to be preferably a value within the range of 5 to 500 nm.

The reason for this is that, when the zinc tin oxide layer has such a predetermined film thickness, more excellent gas barrier capability and adhesiveness are obtained, and a balance between flexibility and gas barrier capability can be achieved.

Therefore, the film thickness of the zinc tin oxide layer is set to be more preferably a value within the range of 10 to 400 nm, further preferably a value within the range of 20 to 350 nm, and particularly preferably a value within the range of 50 to 350 nm.

Incidentally, the film thickness of the zinc tin oxide layer can be measured using a spectroscopic ellipsometer as described specifically in Example 1.

(3) Water-Vapor Transmittance Rate (WVTR)

Furthermore, the water-vapor transmittance rate of the zinc tin oxide layer as measured under the atmosphere of 40° C. and a relative humidity of 90% is set to be preferably a value of 0.1 g/(m$^2$·day) or less.

The reason for this is that, when the water-vapor transmittance rate is such a value, the zinc oxide-based transparent conductive film is prevented from deteriorating and a conductive film excellent in humidity and heat resistance is obtained.

Therefore, the water-vapor transmittance rate of the zinc tin oxide layer is set to be more preferably a value of 0.05 g/(m$^2$·day) or less, and further preferably a value of 0.01 g/(m$^2$·day) or less.

Incidentally, the water-vapor transmittance rate of the zinc tin oxide layer can be measured by a well-known method, and for example, as shown in Example 1, the water-vapor transmittance rate can be measured using a commercially available water-vapor transmittance rate measurement apparatus.

Here, with reference to FIG. 2, the relation between the film thickness of the zinc tin oxide layer in the conductive film and the water-vapor transmittance rate will be described.

Figure 2:
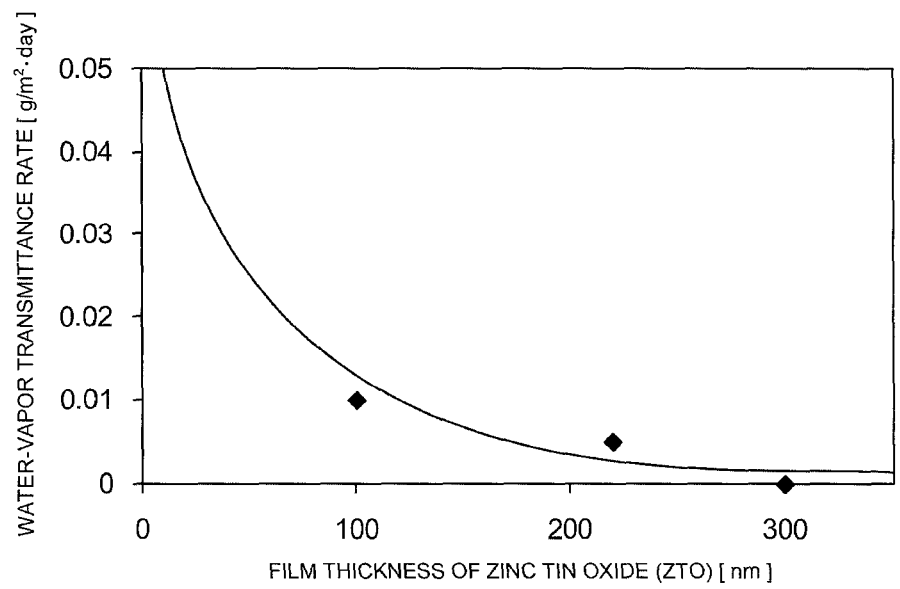
FIG. 2 is a diagram provided to describe the relation between a film thickness of a zinc tin oxide layer in the conductive film and a water-vapor transmittance rate.

That is, the film thickness (nm) of the zinc tin oxide layer is indicated on the horizontal axis of FIG. 2, and the water-vapor transmittance rate (g/(m²·day)) is indicated on the vertical axis of FIG. 2.

Furthermore, when the water-vapor transmittance rate is a value equal to or less than the detection limit of the measurement apparatus, 0 is indicated on the vertical axis.

As seen from FIG. 2, when the film thickness of the zinc tin oxide layer is a value within the range of 5 to 500 nm, infiltration of moisture from the substrate can be reliably blocked and conductivity of the zinc oxide-based transparent conductive film can be prevented from deteriorating due to the moisture. Thus, it is understood that the surface resistivity can be prevented from increasing even when the conductive film is under a humidification and heating environment.

(4) Surface Roughness

As an index for the surface roughness of the zinc tin oxide layer (ZTO layer), an arithmetic mean roughness (Ra) defined by JIS B 0601 is preferably a value within the range of 0.1 to 10 nm.

The reason for this is that, when the arithmetic mean roughness (Ra) of the zinc tin oxide layer (ZTO layer) is a value within the above-described range, adhesiveness between the zinc tin oxide layer and the zinc oxide-based transparent conductive film is sufficiently obtained and thus it is possible to obtain a conductive film with small deterioration in conductivity even after a bending test.

Therefore, the arithmetic mean roughness (Ra) of the zinc tin oxide layer (ZTO layer) is more preferably a value within the range of 0.5 to 5 nm.

Furthermore, for the same reason, the maximum sectional height (Rt) of a roughness curve of the ZTO layer is preferably a value within the range of 0.1 to 100 nm and more preferably a value within the range of 1 to 50 nm.

Incidentally, Ra and Rt of the zinc tin oxide layer (ZTO layer) can be measured using an optical interference microscope as described specifically in Example 1.

(5) Method for Forming Zinc Tin Oxide Layer

Examples of a method for forming a zinc tin oxide (ZTO) layer include a physical production method typified by a sputtering method or a vapor-deposition method, a chemical production method typified by a chemical vapor deposition method, and a coating method such as a bar coater or a micro-gravure coater.

Among them, from the viewpoint that a zinc tin oxide layer can be simply and efficiently formed, a sputtering method or a vapor-deposition method is preferable.

More specific examples of the sputtering method include a DC sputtering method, a DC magnetron sputtering method, an RF sputtering method, an RF magnetron sputtering method, a DC+RF superimposed sputtering method, a DC+RF superimposed magnetron sputtering method, a facing target sputtering method, an ECR sputtering method, and a dual magnetron sputtering method.

Furthermore, more specific examples of the vapor-deposition method include a resistive heating method, an electron beam heating method, a laser heating method, an arc vapor-deposition method, and an induction heating method.

3. Zinc Oxide-Based Transparent Conductive Film (1) Configuration

The zinc oxide-based transparent conductive film 16 illustrated in FIG. 1 is a film that contains a zinc element and has conductivity and transparency.

Examples of a material forming the zinc oxide-based transparent conductive film 16 illustrated in FIG. 1 include metal oxides such as zinc oxide, zinc dioxide, gallium-doped zinc oxide, aluminum-doped zinc oxide, zinc-doped indium oxide (IZO: registered trademark), and zinc- and gallium-doped indium oxide (IGZO), other than zinc tin oxide (ZTO).

That is, the reason for this is that, when the zinc oxide-based transparent conductive film is used, it is possible to obtain a transparent conductive film in which a balance between high transparency and stable conductivity can be achieved.

Among the materials described above, from the viewpoint that an effect obtained by forming a zinc tin oxide layer (improvement of hygrothermal characteristics and bending performance) is easily achieved, gallium-doped zinc oxide is preferable as a material forming the zinc oxide-based transparent conductive film 16.

Furthermore, it is preferable to add, to the metal oxide, one of magnesium, aluminum, titanium, vanadium, manganese, iron, cobalt, nickel, copper, germanium, yttrium, zirconium, niobium, molybdenum, technetium, ruthenium, rhodium, palladium, silver, indium, tin, antimony, lanthanoid, hafnium, tantalum, tungsten, rhenium, iridium, platinum, gold, bismuth, actinoid, gallium and oxides thereof, or a combination of two or more kinds thereof, as a dopant.

The reason for this is that, when such a dopant or the like is added, it is possible to improve performance, such as surface resistivity, light transmittance, or hygrothermal characteristics, of the zinc oxide-based transparent conductive film.

(2) Mixing Amount

Furthermore, the mixing amount of the above-described dopant or the like is set to be preferably a value within the range of 0.05 to 20% by weight.

The reason for this is that it is possible to easily regulate performance such as surface resistivity, light transmittance, or hygrothermal characteristics.

(3) Film Thickness

Furthermore, the film thickness of the zinc oxide-based transparent conductive film 16 illustrated in FIG. 1 is set to be preferably a value within the range of 5 to 1000 nm.

The reason for this is that, when the transparent conductive film has such a film thickness, it is possible to obtain a transparent conductive film in which the film thickness dependency of the specific resistance is low and the value itself of the specific resistance is low.

Therefore, the film thickness of the zinc oxide-based transparent conductive film is set to be more preferably a value within the range of 15 to 500 nm and further preferably a value within the range of 20 to 200 nm.

Incidentally, the film thickness of the transparent conductive film can be measured using a spectroscopic ellipsometer as described specifically in Example 1.

(4) Surface Resistivity

Furthermore, the surface resistivity (R) of the zinc oxide-based transparent conductive film 16 illustrated in FIG. 1 is set to be preferably a value of 500 Ω/square or less, more preferably a value of 300 Ω/square or less, further preferably a value of 200 Ω/square or less, and particularly preferably a value of 150 Ω/square or less.

Incidentally, the surface resistivity of the transparent conductive film can be measured using a surface resistance meter as described specifically in Example 1.

(5) Surface Roughness

As an index for the surface roughness of the zinc oxide-based transparent conductive film, an arithmetic mean roughness (Ra) defined by JIS B 0601 is preferably a value within the range of 0.1 to 10 nm.

The reason for this is that, when the arithmetic mean roughness (Ra) of the zinc oxide-based transparent conductive film is a value within the above-described range, it is possible to obtain a conductive film excellent in conductivity.

Therefore, the arithmetic mean roughness (Ra) of the zinc oxide-based transparent conductive film is more preferably a value within the range of 0.5 to 5 nm.

Furthermore, for the same reason, the maximum sectional height (Rt) of a roughness curve of the zinc oxide-based transparent conductive film is preferably a value within the range of 0.1 to 100 nm and more preferably a value within the range of 1 to 50 nm.

Incidentally, Ra and Rt of the zinc oxide-based transparent conductive film can be measured using an optical interference microscope as described specifically in Example 1.

(6) Method for Forming Zinc Oxide-Based Transparent Conductive Film

Examples of a method for forming a zinc oxide-based transparent conductive film include a physical production method typified by a sputtering method or a vapor-deposition method, and a chemical production method typified by a chemical vapor deposition method.

Among them, from the viewpoint that a zinc oxide-based transparent conductive film can be simply and efficiently formed, a sputtering method or a vapor-deposition method is preferable.

More specific examples of the sputtering method include a DC sputtering method, a DC magnetron sputtering method, an RF sputtering method, an RF magnetron sputtering method, a DC+RF superimposed sputtering method, a DC+RF superimposed magnetron sputtering method, a facing target sputtering method, an ECR sputtering method, and a dual magnetron sputtering method.

Furthermore, more specific examples of the vapor-deposition method include a resistive heating method, an electron beam heating method, a laser heating method, an arc vapor-deposition method, and an induction heating method.

Furthermore, the zinc oxide-based transparent conductive film thus formed may be subjected to patterning as necessary. Examples of a patterning method include chemical etching by photolithography or the like, physical etching by using laser or the like, a vacuum vapor-deposition method or sputtering method using a mask, a lift-off method, and a printing method.

4. Conductive Film (1) Surface Resistivity

The surface resistivity (R1) of the conductive film 10 illustrated in FIG. 1 is practically the same as the surface resistivity (R) of the zinc oxide-based transparent conductive film 16, and description thereof will not be repeated.

(2) Bendability

Regarding the conductive film 10 illustrated in FIG. 1, when a surface resistivity of the conductive film before bending is designated as R1, a surface resistivity of the conductive film after bending of the conductive film using an acrylic round bar having a diameter of 6 mm with the zinc oxide-based transparent conductive film facing inward for 30 seconds is designated as R2, and a surface resistivity of the conductive film after bending of the conductive film using an acrylic round bar having a diameter of 8 mm with the zinc oxide-based transparent conductive film facing outward for 30 seconds is designated as R2', both of R2/R1 and R2'/R1 are set to be preferably a value of 1.5 or less and more preferably a value within the range of 0.9 to 1.2.

The reason for this is that, when both of R2/R1 and R2'/R1 in the conductive film are a value of 1.5 or less, bending characteristics of the conductive film can be determined to be favorable; in other words, deterioration in conductivity can be determined to be small even when the conductive film is bent or stretched.

Therefore, since it is possible to obtain a film which can be wound and to produce a film by a roll-to-roll method, a conductive film can be produced at low cost while high productivity is maintained and thus a decrease in production cost can be achieved.

(3) Hygrothermal Characteristics

Regarding the conductive film 10 illustrated in FIG. 1, when the conductive films are put under the environment of 60° C. and 90% RH for 500 hrs, respectively, then after the conductive films were taken out, the conductive films are conditioned under the environment of 23° C. and 50% RH for 1 day, and the measured surface resistivity is designated as R3, R3/R1 is set to be preferably a value of 0.9 or more but 1.5 or less from R1 and R3 described above.

The reason for this is that, when R3/R1 is a value within the above-described range, hygrothermal characteristics of the conductive film can be determined to be favorable. In other words, since moisture from the substrate can be blocked even when the conductive film is under a humidification and heating environment, conductivity of the zinc oxide-based transparent conductive film can be prevented from deteriorating due to the moisture, and an increase in surface resistivity can be prevented.

(4) Water-Vapor Transmittance Rate (WVTR)

Furthermore, the water-vapor transmittance rate of the conductive film 10 illustrated in FIG. 1 is practically decided by the water-vapor transmittance rate of the zinc tin oxide layer 14. However, the water-vapor transmittance rate of the conductive film 10 as measured under the atmosphere of 40° C. and a relative humidity of 90% is set to be preferably a value of 0.1 $g/(m^2 \cdot day)$ or less, more preferably a value of 0.05 $g/(m^2 \cdot day)$ or less, and further preferably a value of 0.01 $g/(m^2 \cdot day)$ or less.

The reason for this is that, when the conductive film having such a water-vapor transmittance rate is used, for example, for an electrode of an electronic device, performance of an element used for an electronic device can be effectively prevented from deteriorating due to water vapor.

(5) Other Layers

The conductive film of the present invention also preferably includes other layers, such as a hard coat layer, an adhesive layer, an optical adjustment layer, an impact absorbing layer, and a primer layer, on both surfaces or one surface of the conductive film, or in the conductive film although this case is not illustrated in the drawing.

Among the other layers described above, the conductive film of the present invention preferably includes an optical adjustment layer in order to improve optical characteristics. Such an optical adjustment layer may be provided between the zinc tin oxide layer and the substrate or may be provided on the surface of the substrate opposite to the surface on which the zinc tin oxide layer and the zinc oxide-based transparent conductive film are formed.

Furthermore, the conductive film of the present invention preferably includes a primer layer between the substrate and the zinc tin oxide layer. When such a primer layer is provided, adhesiveness between the zinc tin oxide layer and the substrate is improved and thus bendability or hygrothermal characteristics can be further improved. In addition, when the primer layer is provided, unevenness on the surface of the substrate can be flattened and thus a pin hole can be prevented from being formed on the zinc tin oxide layer or the zinc oxide-based transparent conductive film. Furthermore, smoothness of the surface of the zinc oxide-based transparent conductive film can be improved.

Second Embodiment

A second embodiment relates to an electronic device having a conductive film obtained by forming, on one surface or both surfaces of a substrate, a zinc tin oxide (ZTO) layer and a transparent conductive film that is formed of zinc oxide other than zinc tin oxide sequentially from the substrate side.

That is, when the conductive film which is excellent in hygrothermal characteristics and has excellent bending performance is provided, it is possible to obtain an electronic device with a small change in electrical characteristics even when the conductive film is bent or stretched, for example, the conductive film is pasted onto a shape with a curved surface, and with small deterioration in performance due to water vapor.

EXAMPLES

Hereinafter, the present invention will be described in more detail by way of Examples. However, the following description shows the present invention as an illustration and the present invention is not limited to thereto.

Example 1

1. Production of Conductive Film (1) Process 1: Process of Forming Zinc Tin Oxide Layer (ZTO Layer)

A polyethylene terephthalate (PET) film (manufactured by Toyobo Co., Ltd., COSMOSHINE PET A4100, thickness of 100 μm, first surface of Ra=1.2 nm, Rt=25 nm) was prepared as a substrate.

Subsequently, a zinc tin oxide layer was formed on the first surface (smooth surface) of the substrate by a sputtering method using a target material formed of zinc (Zn) and tin (Sn) under the following sputtering conditions so as to have a film thickness of 300 nm.

The element composition of the zinc tin oxide layer thus obtained was analyzed using an XPS measurement and analysis apparatus (manufactured by ULVAC-PHI, Inc., Quantum 2000). As a result of analysis, zinc was a value of 37 atom %, tin was a value of 16 atom %, and oxygen was a value of 47 atom %, relative to the total amount (100 atom %) of zinc, tin, and oxygen.

Substrate temperature: room temperature
Target supplied electric power density: 3 W/cm$^2$
Carrier gas: argon (Ar), oxygen ($O_2$) (40% relative to the total flow rate)
Film formation pressure: 0.5 Pa (2) Process 2: Process of Forming Zinc Oxide-Based Transparent Conductive Film Subsequently, a zinc oxide-based transparent conductive film (described as a GZO film in Table 1) was formed on the formed ZTO layer by a sputtering method using, as a target material, a zinc oxide (GZO) containing 5.7% by weight of digallium trioxide ($Ga_2O_3$) under the following sputtering conditions so as to have a film thickness of 100 nm, thereby preparing a conductive film.

Substrate temperature: room temperature
Target supplied electric power density: 4 W/cm$^2$
Carrier gas: argon (Ar)
Film formation pressure: 0.6 Pa 2. Evaluation of Conductive Film The conductive film thus obtained was subjected to the following measurement, and evaluation was carried out.

(1) Film Thickness

The film thickness of each layer formed on the substrate was measured using a spectroscopic ellipsometer M-2000U (manufactured by J. A. Woollam Co., Inc.). The results thus obtained are presented in Table 1.

(2) Surface Resistivity Measurement of Conductive Film

The surface resistivity (R1) of the conductive film thus obtained was measured under the environment condition of a temperature of 23° C. and 50% RH using LOPRESTA-GP MCP-T600 (manufactured by Mitsubishi Chemical Corporation) as a surface resistance meter and PROBE TYPE ASP (manufactured by Mitsubishi Chemical Analytech Co., Ltd.) as a probe. The results thus obtained are presented in Table 1.

(3) Hygrothermal Characteristic Evaluation

The conductive films thus obtained were put under the environment of 60° C. and 90% RH for 500 hrs, respectively.

Then, after the conductive films were taken out, the conductive films were conditioned under the environment of 23° C. and 50% RH for 1 day, the surface resistivity (R3) was measured, R3/R1 was calculated from the surface resistivity (R1) and the surface resistivity (R3), and the hygrothermal characteristics were evaluated with the following indices. The results thus obtained are presented in Table 1.

Good: $0.9 \leq (R3/R1) \leq 1.5$
Bad: $(R3/R1) > 1.5$ (4) Bendability Evaluation After bending of the conductive film using an acrylic round bar having a diameter of 6 mm with the zinc oxide-based transparent conductive film facing inward for 30 seconds, the surface resistivity (R2) was measured.

Subsequently, after bending of the conductive film using an acrylic round bar having a diameter of 8 mm with the zinc oxide-based transparent conductive film facing outward for 30 seconds, the surface resistivity (R2') was measured.

Then, R2/R1 and R2'/R1 were calculated from the surface resistivity (R1) before bending and the surface resistivity (R2, R2') after bending and the bendability was evaluated with the following indices. The results thus obtained are presented in Table 1.

Good: a case where both of R2/R1 and R2'/R1 are 1.5 or less
Bad: a case where at least one of R2/R1 and R2'/R1 is above 1.5

(5) Measurement of Water-Vapor Transmittance Rate

A sample in a state before forming the zinc oxide-based transparent conductive film was prepared, and the water-vapor transmittance rate of the sample was measured under the environment of 40° C. and 90% RH using the following measurement apparatuses. The water-vapor transmittance rate thus obtained was designated as the water-vapor transmittance rate of the zinc tin oxide (ZTO) layer. The results thus obtained are presented in Table 1.

Incidentally, when the water-vapor transmittance rate is below 0.005 g/(m$^2$·day), this value was the measurement limit of the apparatus, and in this case, "<0.005" was described in Table 1.

When the water-vapor transmittance rate is $1\times10^{-2}$ g/(m²·day) or more, the water-vapor transmittance rate was measured using "PERMATRAN" manufactured by MOCON Inc.

When the water-vapor transmittance rate is below $1\times10^2$ g/(m²·day), the water-vapor transmittance rate was measured using "AQUATRAN" manufactured by MOCON Inc.

(6) Surface Roughness

The surface roughness (Ra, Rt) of each layer of the substrate, the zinc tin oxide layer (ZTO layer), and the zinc oxide-based transparent conductive film (GZO film) was measured using an optical interference microscope (manufactured by Veeco Instruments Inc., NT1100) at an objective lens magnification of 50 and in a PSI mode. The results thus obtained are presented in Table 1.

Example 2

A conductive film 2 was produced in the same manner as in Example 1, except that the thickness of the ZTO layer was changed to 220 nm, and evaluation was carried out. The results thus obtained are presented in Table 1.

Example 3

A conductive film 3 was produced in the same manner as in Example 1, except that the thickness of the ZTO layer was changed to 100 nm, and evaluation was carried out. The results thus obtained are presented in Table 1.

Comparative Example 1

A silicon oxide ($SiO_2$) layer was formed on the first surface (smooth surface) of a PET film as a substrate by a sputtering method under the following conditions so as to have a film thickness of 200 nm.

Subsequently, a zinc oxide-based transparent conductive film was formed on the formed $SiO_2$ layer by the same method as in Example 1, thereby producing a conductive film 4. The results thus obtained are presented in Table 1.

Substrate temperature: room temperature
Target: Si
Target supplied electric power density: 5 W/cm²
Carrier gas: argon (Ar), oxygen ($O_2$) (35% relative to the total flow rate)
Film formation pressure: 0.2 Pa Comparative Example 2

A silicon nitride (SiN) layer was formed on the first surface (smooth surface) of a PET film as a substrate by an ICP-CVD method under the following conditions so as to have a film thickness of 200 nm.

Subsequently, a zinc oxide-based transparent conductive film (GZO film) was formed on the formed SiN layer by the same method as in Example 1, thereby producing a conductive film 5. The results thus obtained are presented in Table 1.

Substrate temperature: room temperature
Power supplied in system: 2000 W
Gas for forming SiN layer: He-300 sccm, $SiH_4$-50 sccm, $NH_3$-150 sccm
Film formation pressure: 5 Pa

TABLE 1

| Layer configuration | Thickness of GZO film/ZTO layer | Surface resistivity (Ω/square) | | | | | | | Hygrothermal characteristics | Bendability | Water-vapor transmittance rate (g/(m²·day)) | ZTO layer | | GZO film | |
|---|---|---|---|---|---|---|---|---|---|---|---|---|---|---|---|
| | | R1 | R2 | R2/R1 | R2' | R2'/R1 | R3 | R3/R1 | | | | Ra (nm) | Rt (nm) | Ra (nm) | Rt (nm) |
| GZO film/ ZTO layer/ substrate | 100 nm/ 300 nm | 105 | 108 | 1.03 | 105 | 1.00 | 108 | 1.03 | Good | Good | <0.005 | 1.3 | 22 | 1.2 | 20 |
| GZO film/ ZTO layer/ substrate | 100 nm/ 220 nm | 105 | 108 | 1.03 | 105 | 1.00 | 108 | 1.03 | Good | Good | 0.005 | 1.3 | 22 | 1.2 | 20 |
| GZO film/ ZTO layer/ substrate | 100 nm/ 100 nm | 105 | 108 | 1.03 | 105 | 1.00 | 108 | 1.03 | Good | Good | 0.01 | 1.2 | 22 | 1.2 | 20 |
| GZO film/ $SiO_2$ layer/ substrate | 100 nm/ 200 nm | 115 | 206 | 1.79 | 190 | 1.65 | 206 | 1.79 | Bad | Bad | 0.55 | 1.3 | 22 | 1.2 | 20 |
| GZO film/ SiN layer/ substrate | 100 nm/ 200 nm | 110 | 187 | 1.70 | 174 | 1.58 | 187 | 1.70 | Bad | Bad | 0.2 | 1.3 | 22 | 1.2 | 20 |

From Table 1, it was found that, regarding the conductive film provided with the zinc tin oxide layer obtained in each Example, a change in surface resistivity before and after bending was 1 or less and a change in surface resistivity due to a high-humidity and high-temperature environment was also small as compared to the conductive film provided with the silicon oxide layer or the silicon nitride layer of Comparative Examples.

Furthermore, it was found that the zinc tin oxide layer has excellent gas barrier capability and can efficiently prevent the infiltration of moisture from the substrate as compared to the silicon oxide layer and the silicon nitride layer.

That is, it was found that the conductive films of Examples provided with the zinc tin oxide layer and the zinc oxide-based transparent conductive film on the substrate are excellent in hygrothermal characteristics and have excellent bending performance.

INDUSTRIAL APPLICABILITY

As described above, according to the conductive film of the present invention, when the zinc tin oxide (ZTO) layer and the zinc oxide-based transparent conductive film other than the ZTO layer are formed on one surface or both surfaces of the substrate sequentially from the substrate side, a conductive film being excellent in hygrothermal characteristics and having excellent bending performance was obtained.

Furthermore, when such a conductive film is included, an electronic device with a small change in electrical characteristics even when the conductive film is bent or stretched, for example, the conductive film is pasted onto a shape with a curved surface, and with small deterioration in performance due to water vapor was efficiently obtained.

Thus, the conductive film of the present invention is expected to be effectively used for various applications such as electrical products, electronic parts, transparent electrodes of image display devices (organic electroluminescence devices, liquid crystal display devices, and the like), solar cells (back sheets for solar cells), transparent conductive materials, PET bottles, packaging containers, and glass containers, for which predetermined hygrothermal characteristics or bending resistance performance is desired.

EXPLANATIONS OF LETTERS OR NUMERALS

10: Conductive film
12: Substrate
14: Zinc tin oxide (ZTO) layer
16: Zinc oxide-based transparent conductive film

The invention claimed is:

1. A conductive film obtained by forming, on one surface or both surfaces of a substrate, a zinc tin oxide layer and a gallium-doped zinc oxide layer as a transparent conductive film that is formed of zinc oxide other than the zinc tin oxide sequentially from the substrate side
    wherein a thickness of the zinc tin oxide layer is 50 to 500 nm,
    wherein a thickness of the gallium-doped zinc oxide transparent conductive film is 100 to 1000 nm,
    wherein a water-vapor transmittance rate of the zinc tin oxide layer is 0.05 g/(m$^2$·day) or less,
    wherein when a surface resistivity of the conductive film before bending is designated as R1, a surface resistivity of the conductive film after bending of the conductive film using an acrylic round bar having a diameter of 6 mm with the zinc oxide-based transparent conductive film facing inward for 30 seconds is designated as R2, and a surface resistivity of the conductive film after bending of the conductive film using an acrylic round bar having a diameter of 8 mm with the zinc oxide-based transparent conductive film facing outward for 30 seconds is designated as R2', both of R2/R1 and R2'/R1 are a value of 1.5 or less, and
    wherein the substrate is formed of at least one selected from the group consisting of polyesters, polyimides, polyamides, and cycloolefin-based polymers.

2. The conductive film according to claim 1, wherein the zinc tin oxide layer contains zinc at a value within the range of 1 to 49 atom %, and tin at a value within the range of 1 to 30 atom % relative to the total amount of 100 atom % of zinc, tin, and oxygen as measured by XPS elemental analysis.

3. An electronic device comprising the conductive film according to claim 1.

* * * * *